United States Patent
Banno

(10) Patent No.: US 6,760,453 B1
(45) Date of Patent: Jul. 6, 2004

(54) PORTABLE TERMINAL DEVICE FOR CONTROLLING RECEIVED VOICE LEVEL AND TRANSMITTED VOICE LEVEL

(75) Inventor: Satoshi Banno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/272,349

(22) Filed: Mar. 19, 1999

(30) Foreign Application Priority Data

Mar. 30, 1998 (JP) .......................................... 10/083262

(51) Int. Cl.⁷ ............................................... H03G 3/00
(52) U.S. Cl. ...................... 381/107; 381/104; 455/563
(58) Field of Search ................... 381/110, 104, 381/106, 107, 98; 455/563, 404, 567

(56) References Cited

U.S. PATENT DOCUMENTS

| | | | | | |
|---|---|---|---|---|---|
| 5,615,256 | A | * | 3/1997 | Yamashita | ................... 381/107 |
| 5,842,139 | A | * | 11/1998 | Muramatsu | ................. 381/110 |

FOREIGN PATENT DOCUMENTS

| | | |
|---|---|---|
| DE | 3426815 A1 | 8/1985 |
| JP | 61-168747 | 10/1986 |
| JP | 61-58862 | 12/1986 |
| JP | 62-278858 | 12/1987 |
| JP | 2-47700 | 3/1990 |
| JP | 2-117228 | 5/1990 |
| JP | 3-52638 | 8/1991 |
| JP | 3-208442 | 9/1991 |
| JP | 4-35144 | 2/1992 |
| JP | 5-191477 | 7/1993 |
| JP | 7-307697 | 11/1995 |
| JP | 8-223256 | 8/1996 |
| JP | 9-321833 | 12/1997 |
| JP | 10-301595 | 11/1998 |
| KR | 96-43556 | 12/1996 |
| WO | WO 99/05840 | 2/1999 |

OTHER PUBLICATIONS

Korean Office Action dated Jul. 24, 2001 with partial English translation.
Japanese Office Action dated May 22, 2001, with partial English translation.

* cited by examiner

*Primary Examiner*—Minsun Oh Harvey
(74) *Attorney, Agent, or Firm*—McGinn & Gibb, PLLC

(57) ABSTRACT

A level of a voice inputted from a microphone 1 is detected in a level detecting section 2. An instantaneous voice level which is sampled every a predetermined time is subjected to an average processing in a processing section 4, and it is outputted as an average voice level. At this time, the first average voice level immediately after starting a telephone conversation is stored in a memory section 6 as a reference amplitude level. During the telephone conversation, a voice level inputted to the microphone 1 is compared with the reference amplitude level in a comparing section 5 every a predetermine time. When the voice level inputted to the microphone 1 is higher than the reference amplitude level, a controlling section 7 increases a voice volume outputted from a speaker 11. On the other hand, the voice level inputted to the microphone 1 is lower than the reference amplitude level, the controlling section 7 decreases the voice volume outputted from the speaker 11.

36 Claims, 10 Drawing Sheets

| DIFFERENCE | CONTROLLING SIGNAL | CONTENT OF CONTROLLING OPERATION |
|---|---|---|
| $D < -4$ | 1 1 0 | SHIFT BY TWO BITS IN RIGHT DIRECTION |
| $-4 \leq D < -2$ | 1 1 1 | SHIFT BY ONE BIT IN RIGHT DIRECTION |
| $-2 \leq D \leq 2$ | 0 0 0 | NO BIT SHIFTING |
| $2 < D \leq 4$ | 0 0 1 | SHIFT BY ONE BIT IN LEFT DIRECTION |
| $D < 4$ | 0 1 0 | SHIFT BY TWO BITS IN LEFT DIRECTION |

Fig.4

| DIFFERENCE D | CONTROLLING SIGNAL | CONTENT OF CONTROLLING OPERATION |
|---|---|---|
| $D < -6$ | 0 1 0 | SHIFT BY TWO BITS IN LEFT DIRECTION |
| $-6 \leq D < -3$ | 0 0 1 | SHIFT BY ONE BIT IN LEFT DIRECTION |
| $-3 \leq D \leq 3$ | 0 0 0 | NO BIT SHIFTING |
| $3 < D \leq 6$ | 1 1 1 | SHIFT BY ONE BIT IN RIGHT DIRECTION |
| $6 < D$ | 1 1 0 | SHIFT BY TWO BITS IN RIGHT DIRECTION |

Fig.7

PORTABLE TERMINAL DEVICE FOR CONTROLLING RECEIVED VOICE LEVEL AND TRANSMITTED VOICE LEVEL

BACKGROUND OF THE INVENTION

1. Field of the Invention

The present invention relates to a portable terminal device, more particularly to a portable terminal device for controlling a received voice level in a receiver and a transmitted voice level in a transmitter.

2. Description of the Related Art

When during a telephone conversation using a portable terminal device, it is hard to catch the other person's words for a reason that a voice from the other person (a person who speaks with a user of a telephone by the telephone) outputted from a speaker is too quiet or too loud, the user hitherto adjusts the received voice volume by pressing a volume button equipped in the device. However, with such system the user must bother to press the volume button during the telephone conversation. For this reason, there has been a problem that this operation is troublesome. Since the user usually performs the telephone conversation while holding the portable terminal device by hand, when the volume button for adjusting the received voice volume is provided in the vicinity of the speaker, there has been a problem that the portable terminal device is inconvenient for the user because of an occurrence of a situation such as failing to feel the position of the volume button.

Therefore, a portable mobile telephone which automatically adjusts the received voice volume without the operation by the user is proposed.

Such kind of portable mobile telephone is disclosed, for example, in Japanese Patent Laid-open No. 2-117228.

This portable mobile telephone detects the noise level around the user, which is included in signal components inputted from the microphone. The voice volume outputted from the speaker is controlled depending on the noise level detected around the user in the following manner. When the noise level around the user increases, the voice volume outputted from the speaker is increased. On the other hand, when the noise level around the user decreases, the voice volume outputted from the speaker is reduced. Thus, an influence upon the received voice volume affected by the noise around the user is removed.

On the other hand, this portable mobile telephone decides whether or not a voice of the user is inputted from microphone. A gain of an output signal of the microphone is controlled based on the decision result in the following manner. If the voice of the user is not inputted, the gain of the output signal of the microphone is reduced, and if the voice of the user is inputted, the gain thereof is increased. Thus, an increase in the gain of the noise component at the time when the voice is not inputted is prevented.

However, this portable mobile telephone controls the received voice volume only depending on the noise level around the user. For this reason, it is impossible to vary the received voice volume by the user's will. For example, in a situation where the noise level around the user is low, the voice volume outputted from the speaker becomes quiet. When the voice volume of the other person is low from the first, the voice volume outputted from the speaker becomes lower. Therefore, it is hard for the user to catch the voice of the other person. At this time, since the voice volume outputted from the speaker is controlled based on the noise level around the user, it is impossible to increase the voice volume in spite of the user's will to increase the voice volume. Furthermore, when the user intends to increase the voice volume outputted from the speaker, the user must adjust the received voice volume by manipulating the volume button as in the conventional portable terminal device.

With reference to this portable mobile telephone, when an input voice level of the user decreases, for example, when the user's input voice level decreases because of keeping the microphone apart from the user's mouth, an output voice volume level of the other persons from the speaker is too low. Therefore, the other person must adjust the received voice volume by manipulating the volume button.

SUMMARY OF THE INVENTION

The object of the present invention is to provide a portable terminal device obtained by further improving the conventional portable terminal device.

Another object of the present invention is to provide a portable terminal device which is capable of automatically changing a received voice volume according to a user's will by controlling a voice volume outputted from a speaker depending on an input voice level of the user.

Still another object of the present invention is to provide a portable terminal device which makes constant an input voice level of a user and transmits the constant input voice to the other person, thereby removing a necessity for excessive manipulations for controlling a received voice volume by the other person.

In order to achieve the foregoing objects, the portable terminal device of the present invention comprises: a voice inputting section for inputting a voice; a voice outputting section for outputting a voice; detecting section for detecting a level of the voice inputted by the voice inputting section; and a control section for controlling either a level of the voice outputted from the voice outputting section or the level of the voice inputted from the voice inputting section, depending on an input voice level detected by the detecting section. The portable terminal device of the present invention should further comprise a comparing section for comparing a reference level with the input voice level detected by the detecting section.

When it is decided by the comparing section that the inputting voice level is higher than the reference level, the controlling section increases the level of the voice which is outputted by the voice outputting section. When it is decided by the comparing section that the inputting voice level is lower than the reference level, the controlling section decreases the level of the voice which is outputted by the voice outputting section. Furthermore, when it is decided by the comparing section that the inputting voice level is higher than the reference level, the controlling section decreases the level of the voice which is inputted by the voice outputting section. When it is decided by the comparing section that the inputting voice level is lower than the reference level, the controlling section increases the level of the voice which is inputted by the voice outputting section. Furthermore, when it is decided by the comparing section that the inputting voice level is higher than the reference level, the controlling section decreases the level of the voice which is inputted by the voice outputting section and increases the level of the voice which is outputted by the voice outputting section. When it is decided by the comparing section that the inputting voice level is lower than the reference level, the controlling section increases the level of the voice which is inputted by the voice outputting section and decreases the level of the voice which is outputted by the voice outputting section.

The portable terminal device of the present invention should further comprise a selecting section for selecting either a control of the level of the voice inputted by the voice outputting section or a control of the level of the voice outputted by the voice outputting section. The reference level is an inputting voice level detected by the detecting section during the telephone conversation. Furthermore, the reference level should preferably be an inputting voice level detected by the detecting section immediately after starting the telephone conversation. At this time, the reference level should preferably be erased upon termination of the telephone conversation. The portable terminal device of the present invention should preferably further comprise a selecting section for selecting at least one of the inputting voice level detected by the detecting section immediately after starting the telephone conversation and a level previously determined, as the reference level. The level should preferably be a voice amplitude level.

The detecting section should preferably comprise: an extracting section for extracting the level of the voice every a first predetermined time, which is inputted by the voice inputting section; and a computing section for computing an average of the inputting voice level every a second predetermined time, which is extracted by the extracting section. The comparing section should preferably compare the reference level with the average of the inputting voice level computed by the computing section.

The portable terminal device of the present invention should preferably comprise: a first deciding section for deciding a level of a first voice inputted by the voice inputting section immediately after staring the telephone conversation; a second deciding section for deciding a level of a second voice inputted by the voice inputting section after the level of the first voice is decided by the first deciding section; and a computing section for computing a difference between the level of the first voice and the level of the second voice.

At this time, when the difference is larger than a predetermined first threshold, provided is a first outputting section for outputting a first controlling signal to increase the level of the voice which is outputted by the voice outputting section; when the difference is equal to or larger than a predetermined second threshold and the difference is equal to or lower than the first threshold, provided is a second outputting section for outputting a second controlling signal which does not increase and does not decrease the level of the voice outputted by the voice outputting section; and when the difference is lower than the second threshold, provided is a third outputting section for outputting a third controlling signal to decrease the level of the voice outputted by the voice outputting section, and the controlling section controls the level of the voice outputted by the voice outputting means, based on the first to third controlling signals.

Furthermore, when the difference is larger than a predetermined first threshold, provided is a first outputting section for outputting a first controlling signal to decrease the level of the voice inputted by the voice inputting section; when the difference is equal to or larger than a predetermined second threshold and the difference is equal to or lower than the first threshold, provided is a second outputting section for outputting a second controlling signal which does not increase and does not decrease the level of the voice inputted by the voice inputting section; and when the difference is smaller than the second threshold, provided is a third outputting section for outputting a third controlling signal to increase the level of the voice inputted by the voice inputting section, and the controlling section controls the level of the voice inputted by the voice inputting section, based on the first to third controlling signals.

Furthermore, when the difference is larger than a predetermined first threshold, provided is a first outputting section for outputting a first controlling signal to decrease the level of the voice inputted by the voice inputting section and to increase the level of the voice outputted by the voice outputting section; when the difference is equal to or larger than a predetermined second threshold and the difference is equal to or lower than the first threshold, provided is a second outputting section for outputting a second controlling signal which does not increase and does not decrease the level of the voice inputted by the voice inputting section and the level of the voice outputted by the voice outputting section; and when the difference is smaller than the second threshold, provided is a third outputting section for outputting a third controlling signal to increase the level of the voice inputted by the voice inputting section and to decrease the level of the voice outputted by the voice outputting section, and the controlling section controls the level of the voice inputted by the voice inputting section and the level of the voice outputted by the voice outputting section, based on the first to third controlling signals. When the second controlling signal is outputted by the second outputting section, the controlling section controls the level of the voice outputted by the voice outputting section, based on the first and third controlling signals which was outputted prior to the second controlling signal. Furthermore, when the second controlling signal is outputted by the second outputting section, the controlling section controls the level of the voice inputted by the voice inputting section, based on said level of a first voice. The portable terminal device should be a portable telephone.

A voice level controlling method of a portable terminal device of the present invention comprises: a step for inputting a voice; a step for detecting a level of the voice inputted; a step for outputting the voice; and a step for controlling at least one of the level of the voice inputted in the voice inputting step and a level of the voice outputted in the voice outputting step, based on the level of the voice detected. Furthermore, the voice level controlling method of a portable terminal device of the present invention should preferably further comprise a step for comparing a reference level with the inputted voice level detected in the detection step.

When it is decided in the comparing step that the inputted voice level is higher than the reference level, the level of the voice outputted in the voice outputting step is increased in the in the controlling step, and when it is decided in the comparing step that the inputted voice level is lower than the reference level, the level of the voice outputted in the voice outputting step is decreased in the controlling step. Furthermore, when it is decided in the comparing step that the inputted voice level is higher than the reference level, the level of the voice inputted in the voice inputting step is decreased in the controlling step, and when it is decided in the comparing step that the inputted voice level is lower than the reference level, the level of the voice inputted in the voice inputting step is increased in the controlling step. Furthermore, when it is decided in the comparing step that the inputted voice level is higher than the reference level, the level of the voice inputted in the voice inputting step is decreased and the level of the voice outputted in the voice outputting step is increased in the controlling step, and when it is decided in the comparing step that the inputted voice level is lower than the reference level, the level of the voice inputted in the voice inputting step is increased and the level of the voice outputted in the voice outputting step is decreased in the controlling step.

The detection step should preferably comprise: a step for extracting a level of the voice every a predetermined first time, which is inputted in the foregoing voice inputting step; and a step for computing an average of the extracted inputted voice level in a predetermined second time, and the comparing step should preferably compare the average of the inputted voice level computed in the computing step with the reference level.

A voice level controlling method of a portable terminal device of the present invention should preferably comprise: a step for deciding a level of a first voice inputted in the voice inputting step after starting a telephone conversation; a step for deciding a level of a second voice inputted in the voice inputting step after deciding the level of the first voice; and a step for computing a difference between the level of the first voice and the level of the second voice.

At this time, when the difference is larger than a predetermined first threshold, provided is a step for outputting a first controlling signal to increase the level of the voice outputted in the voice outputting step; when the difference is equal to or more than a predetermined second threshold and the difference is equal to or less than the first threshold, provided is a step for outputting a second controlling signal which does not increase and does decrease the level of the voice outputted in the voice outputting step; and when the difference is smaller than the second threshold, provided is a step for outputting a third controlling signal to decrease the level of the voice outputted in the voice outputting step, and the controlling step controls the level of the voice outputted in the voice outputting step, based on the first to third controlling signals.

Furthermore, when the difference is larger than a predetermined first threshold, provided is a step for outputting a first controlling signal to decrease the level of the voice inputted in the voice inputting step; when the difference is equal to or more than a predetermined second threshold and the difference is equal to or less than the first threshold, provided is a step for outputting a second controlling signal not to increase and decrease the level of the voice inputted in the voice inputting step; and when the difference is smaller than the second threshold, provided is a step for outputting a third controlling signal to increase the level of the voice inputted in the voice inputting step, and the controlling step controls the level of the voice inputted in the voice inputting step, based on the first to third controlling signals.

Furthermore, when the difference is larger than a predetermined first threshold, provided is a step for outputting a first controlling signal to decrease the level of the voice inputted in the voice inputting step and to increase the level of the voice outputted in the voice outputting step; when the difference is equal to or more than a predetermined second threshold and the difference is equal to or less than the first threshold, provided is a step for outputting a second controlling signal not to increase and decrease the level of the voice inputted in the voice inputting step and the level of the voice outputted in the voice outputting step; and when the difference is smaller than the second threshold, provided is a step for outputting a third controlling signal to increase the level of the voice inputted in the voice inputting step and to decrease the level of the voice outputted in the voice outputting step, and the controlling step controls the level of the voice inputted in the voice inputting step and the level of the voice outputted in the voice outputting step, based on the first to third controlling signals.

As described above, in the present invention, when the voice level received by the user becomes lower than a reference amplitude level, the voice level of the other person outputted from the speaker is lowered. On the other hand, when the voice level received by the user becomes higher than the reference amplitude level, the voice level of the other person outputted from the speaker is elevated. Therefore, it is possible to control the voice level of the other person outputted from the speaker in accordance with the voice level received by the user. That is, the received voice volume can be adjusted by the user's will.

Furthermore, in the present invention, even when the inputted voice level which is taken in from the microphone temporarily changes, the inputted voice level of the user is adjusted so as to be approximately equal to the reference amplitude level and sent to the other person. Therefore, it is possible to remove a difficulty to catch the user's words and displeasure due to temporal changes of the inputted voice level, which are given to the other person.

BRIEF DESCRIPTION OF THE DRAWINGS

These and other objects, features and advantages of the invention will be becomes fully apparent from the following detailed description taken in conjunction with accompanying drawings.

FIG. 4 is a figure showing a preferred example of a relationship between a shift number which is shifted by a bit shifting section and a controlling signal outputted from a controlling section.

FIG. 7 is a figure showing a preferred example of a relationship between a shift number which is shifted by a microphone voice bit shifting section and a controlling signal outputted from a controlling section.

DETAILED DESCRIPTION OF THE PREFERRED EMBODIMENT

Figure 1:
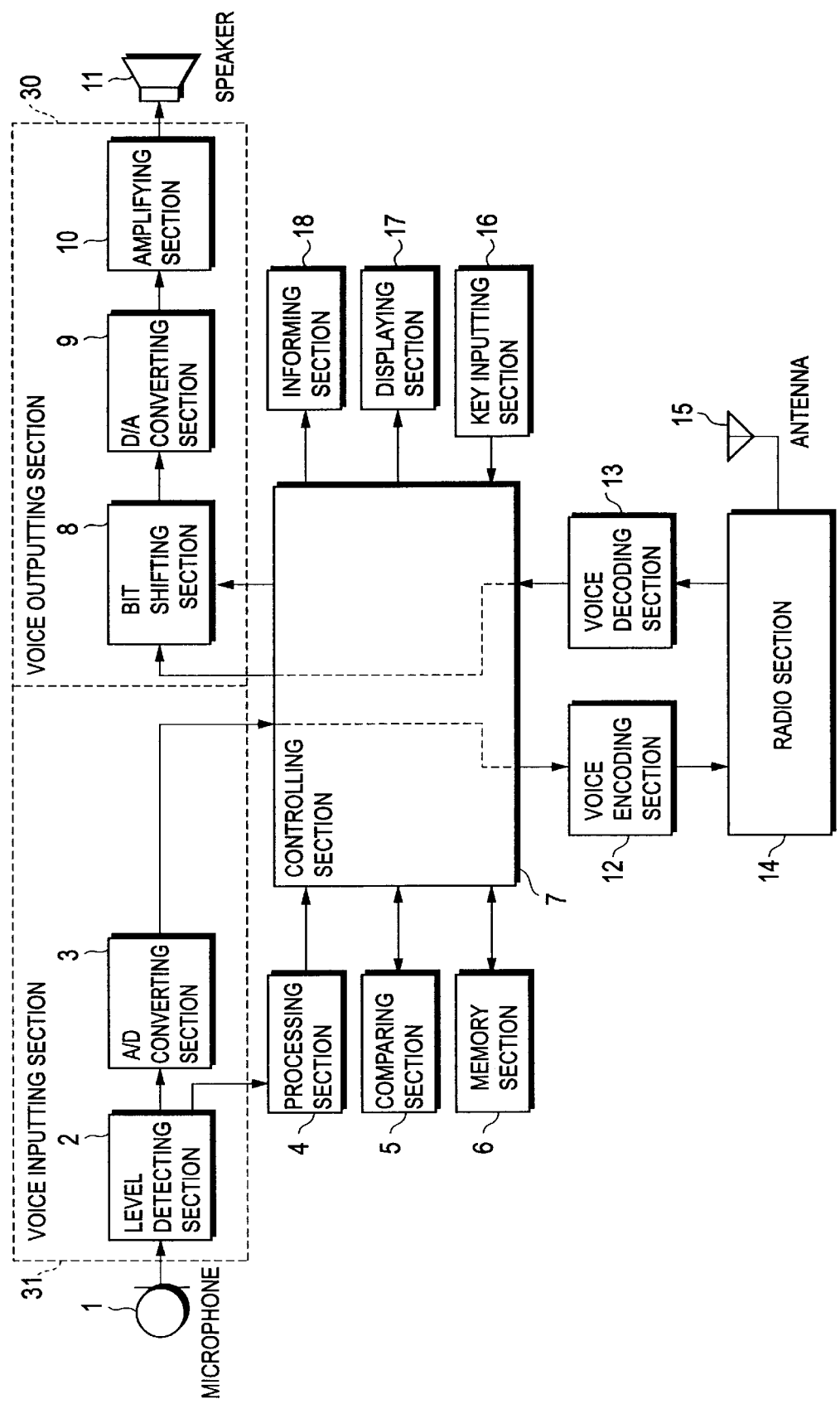
FIG. 1 is a block diagram showing a preferred example of a circuit constitution of a portable terminal device according to a first embodiment of the present invention.

FIG. 1 is a block diagram showing a portable terminal device according to a first embodiment of the present invention, preferably a block diagram showing a preferred example of an internal circuit of the portable telephone.

Referring to FIG. 1, a microphone 1 takes a voice signal into a telephone unit in order to transmit an external voice in radio. A voice inputting section 31 inputs and processes an analog voice signal taken from the microphone 1. The voice inputting section 31 comprises a level detecting section 2 for detecting a voice amplitude of the analog voice signal taken from the microphone 1 thereinto as a voice level; and an A/D converting section 3 for converting the analog voice signal outputted from the level detecting section 2 to a digital voice signal. A voice encoding section 12 encodes the digital voice signal outputted from the A/D converting section 3. In a Personal Handy phone System (PHS), this voice encoding section 12 adopts, for example, an encoding according to an ADPCM method. In a full rate of a Personal Digital Cellular (PDC) the voice encoding section 12 adopts an encoding according to a VSELP method, and in a half rate of the PDC the voice encoding section 12 adopts an encoding according to a PSI-CELP method. A radio section 14 modulates the voice signal encoded by the voice encoding section 12 and transmits it to a base station (not shown) from an antenna 15. The radio section 14 decodes a voice signal received through the antenna 15.

A processing section 4 computes an average voice amplitude level in a prescribed time, based on a voice amplitude level outputted from the level detecting section 2. A comparing section 5 compares a reference amplitude level with the average voice amplitude level computed by the processing section 4. A memory section 6 stores a reference amplitude level value, a controlling signal information and the like.

A voice decoding section 13 decodes the voice signal received by the radio section 14 from the base station (not shown) through the antenna 15. A voice outputting section 30 performs a processing for outputting the decoded voice signal by the voice decoding section 13 to the outside. The voice outputting section 30 comprises: a bit shifting section 8 which receives the digital voice signal decoded by the voice decoding section 13 and performs a bit shift for the digital voice signal depending on a level difference computed by the comparing section 5; a D/A converting section 9 which converts a digital signal outputted from the bit shifting section 8 to an analog signal; and an amplifying section 10 which amplifies the analog signal converted by the D/A converting section 9 and allows a speaker 11 to output it therefrom. The speaker 11 outputs data to the outside, which has been subjected to a processing for outputting it.

An informing section 18 informs an arrival of a voice to the users telephone. The informing section 18 should preferably be composed of at least one of a speaker, a vibrator and an LED. When the informing section 18 is the speaker, the section 18 may serve also as the speaker 11. A displaying section 17 displays numerals and the like inputted by pressing keys. The displaying section 17 should be any one of a CRT and an LCD. A key inputting section 16 performs a key inputting operation for a telephone number and the like. A controlling section 7 performs a controlling processing concerning various kinds of operations.

Using FIG. 2, a preferred example of an operation of the portable telephone shown in FIG. 1 will be described.

Figure 2:
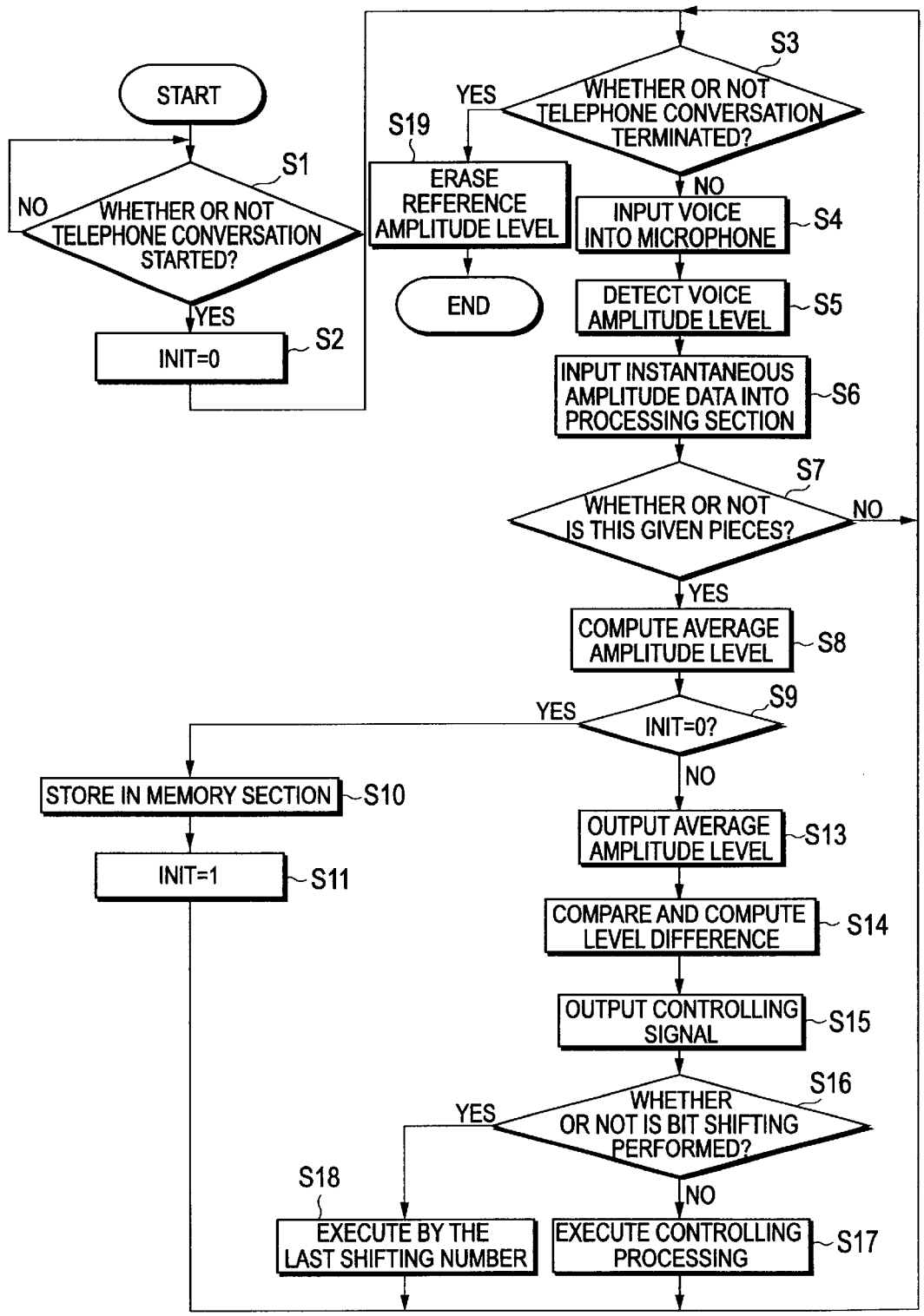
FIG. 2 is a flowchart showing a preferred example of an operation of the portable terminal device shown in FIG. 1.

Referring to FIG. 2, when a radio signal from a base station (not shown) is received by the antenna 15, the informing section 18 informs a reception of the radio signal. When the user presses down the receiving key of the key inputting section 16 in response to the information from the informing section 18, the telephone conversation starts (step S1). Or, when the user calls the other person up by inputting the phone number of the other person using the key inputting section 16, the telephone conversation starts (step S1). After the telephone conversation started, an INIT flag that is an internal signal of a LSI built in the controlling section 7 is set to "0" (step S2). Thereafter, it is decided whether or not the telephone conversation has been terminated (step S3). When it is decided that the telephone conversation has not been terminated (NO in step S3), based on an analog voice signal inputted from the microphone 1 (step S4), its voice amplitude level is detected in the level detecting section 2 (step S5). Amplitude information concerning the analog voice signal inputted to the level detecting section 2 is sampled every time Ts, for example, 5 mil-second, and an extraction of the instantaneous amplitude level is performed. The instantaneous amplitude level data extracted is sent to the processing section 4 (step S6). The processing section 4 computes an average of the instantaneous amplitude level (step S8) every a predetermined time, for example, 0.5 second, or every the number of extracted data, for example, 100 pieces (step S7). At this time, with respect to a negative amplitude level, the computation is performed for its absolute value. Furthermore, soundless portions are not treated as an objective of the computation. Every time of inputting of the analog voice, the foregoing sampling extraction and computing processing are performed.

Next, it is decided whether or not the INIT flag is "0" (step S9). When it is decided that the INIT flag is "0" (YES in step S9), the first average voice amplitude level in the first voice at the time when the telephone conversation starts is stored in the memory section 6 as a reference amplitude level (step S10). After the reference amplitude level is stored in the memory section 6, the INIT flag is set to "1" (step S11). The reference amplitude level stored in the memory section 6 is held until the telephone conversation is terminated, and the reference amplitude is erased upon termination of the telephone conversation (step S19).

After the reference amplitude level is confirmed, that is, the INIT flag is set to "1", the processings from the foregoing step S3 to S7 are performed again. When a next average voice amplitude level is computed in the processing section 4 (step S8), the computed average voice amplitude level is outputted to the comparing section 5 (step S13), and the average voice amplitude level computed is compared with the reference amplitude level stored in the memory section 6 (step S14). The comparing section 5 compares the computed average voice amplitude level with the reference amplitude level, and obtains a difference between them. Specifically, the comparing section 5 computes the difference between the reference amplitude level and the average voice amplitude level, and outputs the computation result to the controlling section 7. The controlling section 7 outputs a controlling signal based on the computation result outputted from the comparing section 5 to the bit shifting section 8 (step S15).

When the controlling signal is inputted to the bit shifting section 8, the bit shifting section 8 decides whether or not the controlling signal is a signal indicating that "it is not shifted" (step S16). When it is decided that the controlling signal is a signal indicating that "it is shifted" (NO in step S16), a level of a voice signal of the other person received through the antenna 15 is shifted by predetermined bits based on the controlling signal (step S17). On the other hand, when it is decided that the controlling signal is a signal indicating that "it is not shifted" (YES in step S16), the level of the voice signal of the other person is shifted by the bit number equal to that of the last shift (step S18). For example, considerations are made for the case where the amplitude level of the voice inputted to the microphone becomes higher than the reference amplitude level and the level of the voice signal of the other person is shifted once. Thereafter, even if the amplitude level of the voice inputted to the microphone by the user returns to the reference amplitude level and the controlling signal indicating that "it is not shifted" is inputted, the voice signal of the other person is outputted with the amplitude level the bit of which has been shifted in the last time. Therefore, after, for example, noises around the user becomes loud and the level of the inputted voice by the user becomes higher during the telephone conversation, even if the mouth of the user is made to be apart from the microphone unconsciously and the level of the inputted voice of the user returns to the reference amplitude level, the voice level of the other person outputted from the speaker does not become low. In other words, the outputted voice level is kept as it is.

At the first time of telephone conversation, controlling signal has a value meaning that it is not shifted as a default value. Therefore, when the amplitude level that was shifted in the last time does not exist, specifically, when the reference amplitude level is detected at the beginning of the telephone conversation, the level of the voice inputted after the beginning of the telephone conversation is near the reference amplitude level, and the controlling signal indicating that "it is not shifted" is outputted, the default value "that it is not shifted" is executed.

The voice signal outputted from the bit shifting section 8 is inputted to the D/A converting section 9, and converted from a digital voice signal to an analog voice signal. The analog voice signal is amplified to a predetermined level by the amplifying section 10 and then outputted from the speaker 11 as a voice.

Using FIGS. 3 and 4, a preferred example of an operation of the portable telephone of this embodiment shown in FIG. 2 will be described.

Referring to FIG. 2, when a telephone conversation starts (step S1), a leading average voice amplitude level of the first voice of the user's speech is computed by the processing section 4 (step S8). As shown in FIG. 3, it is assumed that the computing result is "5". Since the INUT flag is "0" at this time (YES in step S9), the computing result "5" is stored in the memory section 6 as the reference amplitude level value "5" (step S11).

Next, the second average voice amplitude level is computed by the processing section 4 (step S8). Since the INIT flag is "1" at this time (step S11), the average voice amplitude level is outputted to the comparing section 5 (step S13), and a difference between the average voice amplitude level and the reference amplitude level "5" stored in the memory section 6 is computed by the comparing section 5 (step S14).

Figure 3:
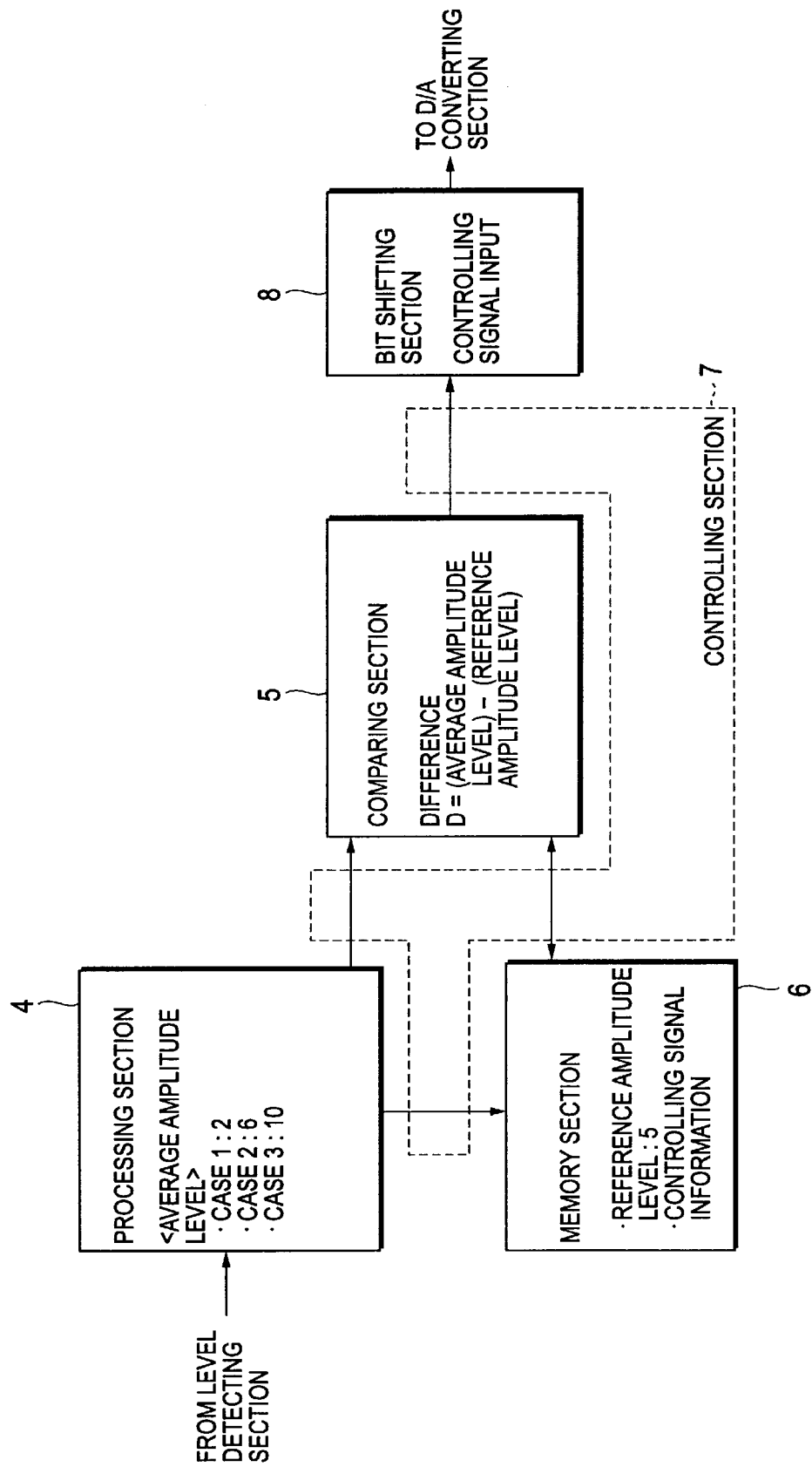
FIG. 3 is a preferred example of a circuit block diagram obtained by extracting main components from the circuit block diagram of the portable terminal device shown in FIG. 1.

Hereupon, descriptions will be made for CASEs 1 to 3 of the average voice amplitude level outputted to the comparing section 5, as shown in FIG. 3.

In the case of the CASE 1, since the average voice amplitude level is "2", the difference D is computed according to D=2–5. At this time, for the difference D, controlling signal information for use in controlling the voice volume of the speaker 11 corresponding to the difference D is previously determined, and it is stored in the memory section 6 as a known value. This example is shown in FIG. 4. In the case of the CASE 1, since the difference D is equal to "–3", a signal expressed as "111" is outputted to the bit shifting section 8 as a controlling signal (step S15).

Similarly, in the case of the CASE 2, since the difference D is equal to "1", a signal expressed as "000" is outputted to the bit shifting section 8 as a controlling signal. In the case of the CASE 3, since the difference D is equal to "5", a signal expressed as "010" is outputted to the bit shifting section 8 as a controlling signal.

The voice signal of the other person received by the radio section 14 through the antenna 15 is inputted to the bit shifting section 8 from the voice decoding section 13 as a digital voice signal. The digital voice signal inputted to the bit shifting section 8 is controlled in its outputted voice level based on the controlling signal outputted from the controlling section 7 (steps S16 to S18), so that a voice volume outputted from the speaker 11 is controlled.

Using FIG. 4, the relationship between the controlling signal and the shift number of the voice signal of the other person shifted by the bit shifting section 8 will be described.

Referring to FIG. 4, when the controlling signal is expressed as "000", it is decided that there is no large difference between the reference amplitude level computed by the comparing section 5 and the average voice amplitude level, and the bit shifting is not performed. Therefore, the voice signal of the other person is outputted as received.

Furthermore, when the controlling signal is expressed as "001" and "010", it is decided that the average voice amplitude level is higher than the reference amplitude level, that is, it decided that the voice volume that is currently being uttered becomes larger than the voice volume of the first speech uttered by the user. Therefore, the bit shift in the bit shifting section 8 is carried out in the direction where the level of the voice signal becomes higher, that is, the level of the voice signal is shifted in the left direction. The shift number more increases as the absolute value of the difference D becomes larger. In the example shown in FIG. 4, the bit shift in the left direction can be possible up to two bits at maximum.

On the other hand, when the controlling signal is expressed as "111" and "110", it is decided that the average voice amplitude level is lower than the reference amplitude level, that is, it is decided that the voice volume that is currently being uttered is becomes smaller than the voice volume of the first speech uttered by the user. Therefore, the bit shift in the bit shifting section 8 is carried out in the direction where the level of the voice signal becomes lower, that is, the level of the voice signal is shifted in the right direction. The shift number more increases as the absolute value of the difference D becomes larger. In the example shown in FIG. 4, the bit shift in the right direction can be possible up to two bits at maximum.

The relationship between the controlling signal shown in FIG. 4 and the shift number shifted by the bit shifting section 8 is previously stored in the memory section 6 shown in FIG. 1.

In the case of the CASE 1 shown in FIG. 3, the controlling signal expressed as "111" is outputted to the bit shifting section 8 (step S15). Therefore, the bit shift in the bit shifting section 8 is executed in a direction where the level of the voice signal becomes lower, that is, the bit shift is executed by one bit in the right direction (NO in step S16). Therefore, the voice signal of the other person received by the radio section 14 through the antenna 15 is shifted in its outputted voice level by the bit shifting section 8 by one bit in the right direction, and the voice signal of the other person is outputted from the speaker 11 with a smaller volume by one bit (step S17).

Similarly, in the case of the CASE 2, the controlling signal expressed as "000" is outputted to the bit shifting section 8

(step S15). Therefore, the bit shift in the bit shifting section 8 is not executed (YES in step S16). Therefore, the voice signal of the other person received by the radio section 14 through the antenna 15 is not shifted in its outputted voice level by the bit shifting section 8, and the voice signal of the other person is outputted from the speaker 11 as it is (step S18).

In the case of the CASE 3, the controlling signal expressed as "010" is outputted to the bit shifting section 8 (step S15). For this reason, the bit shift in the bit shifting section 8 is executed in a direction where the level of the voice signal becomes higher, that is, the bit shift is executed by two bits in the left direction (NO in step S16). Therefore, the voice signal of the other person received by the radio section 14 through the antenna 15 is shifted in its outputted voice level by the bit shifting section 8 by two bits in the left direction, and the voice signal of the other person is outputted from the speaker 11 while having a larger volume by two bits (step S17).

Figure 5A:
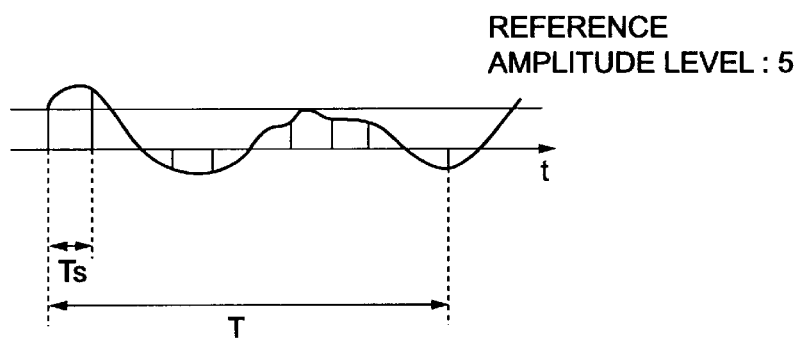
FIGS. 5a–5c are preferred examples of a waveform of a voice signal inputted to a microphone and a voice signal outputted from a speaker.
Figure 5B:
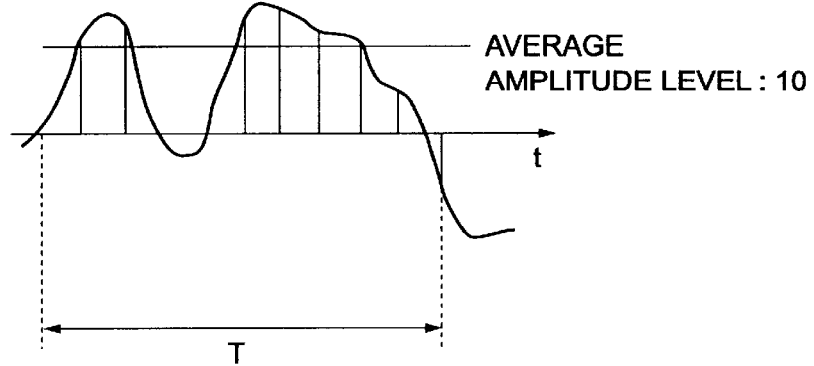
Figure 5C:
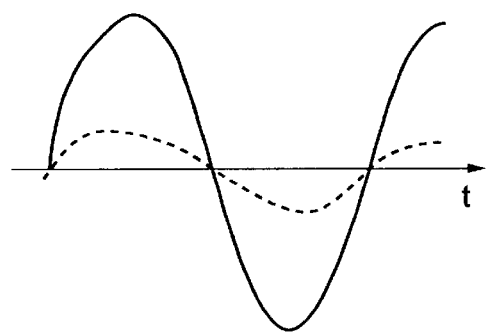

Using FIGS. 5a to 5c, with reference to the case of the CASE 3 shown in FIG. 3, a preferred example of waveforms of the voice signal inputted to the microphone 1 and the voice signal outputted from the speaker 11 will be shown.

FIG. 5a is a waveform of the voice signal of the first speech uttered by the user immediately after the start of the telephone conversation. With reference to an analog signal inputted to the level detecting section 2, its amplitude information is sampled every a predetermined time Ts, for example, 5 mil-second, and an extraction for its instantaneous amplitude level is performed. The extracted instantaneous amplitude level data is sent to the processing section 4, and an average, for example, "5" of the plural instantaneous amplitude levels which are extracted for a predetermined time T, for example, 0.5 second, is computed. This average "5" is computed is set as a reference amplitude level relative to a voice to be inputted after that time.

FIG. 5b is a signal waveform of a second voice uttered by the user after the predetermined time T, for example, 0.5 second, at the time when the reference amplitude level is set. Similarly to FIG. 5a, an instantaneous amplitude is extracted every a predetermined time Ts, for example, 5 mil-second, and an average, for example, "10" of the plurality of instantaneous amplitude levels which are extracted for a predetermined time T after passage of a predetermined time T, for example, a predetermined time 0.5 second, is computed. As an average voice amplitude level, this average "10" is compared with the reference amplitude level which was set in FIG. 5a. As a result of the compare, the difference "5" between the average voice amplitude level "10" and the reference amplitude level "5" is detected, and the controlling signal "010" is outputted to the bit shifting section 8.

Considerations are made for the case where after an average voice amplitude level of a second voice uttered by the user is detected in FIG. 5b, a voice signal of the other person is outputted while having a voice level shown by the dotted line of FIG. 5c. At this time, the outputted voice level is shifted by two bits in the left direction in the bit shifting section 8, and the voice signal of the other person is outputted from the speaker 11 with a voice level higher by two bits shown by the solid line of FIG. 5c.

As described above, according to the portable telephone of this embodiment, since the voice volume outputted from the speaker is controlled in accordance with the voice level inputted by the user, the received voice volume can be automatically adjusted by the user's will.

Figure 6:
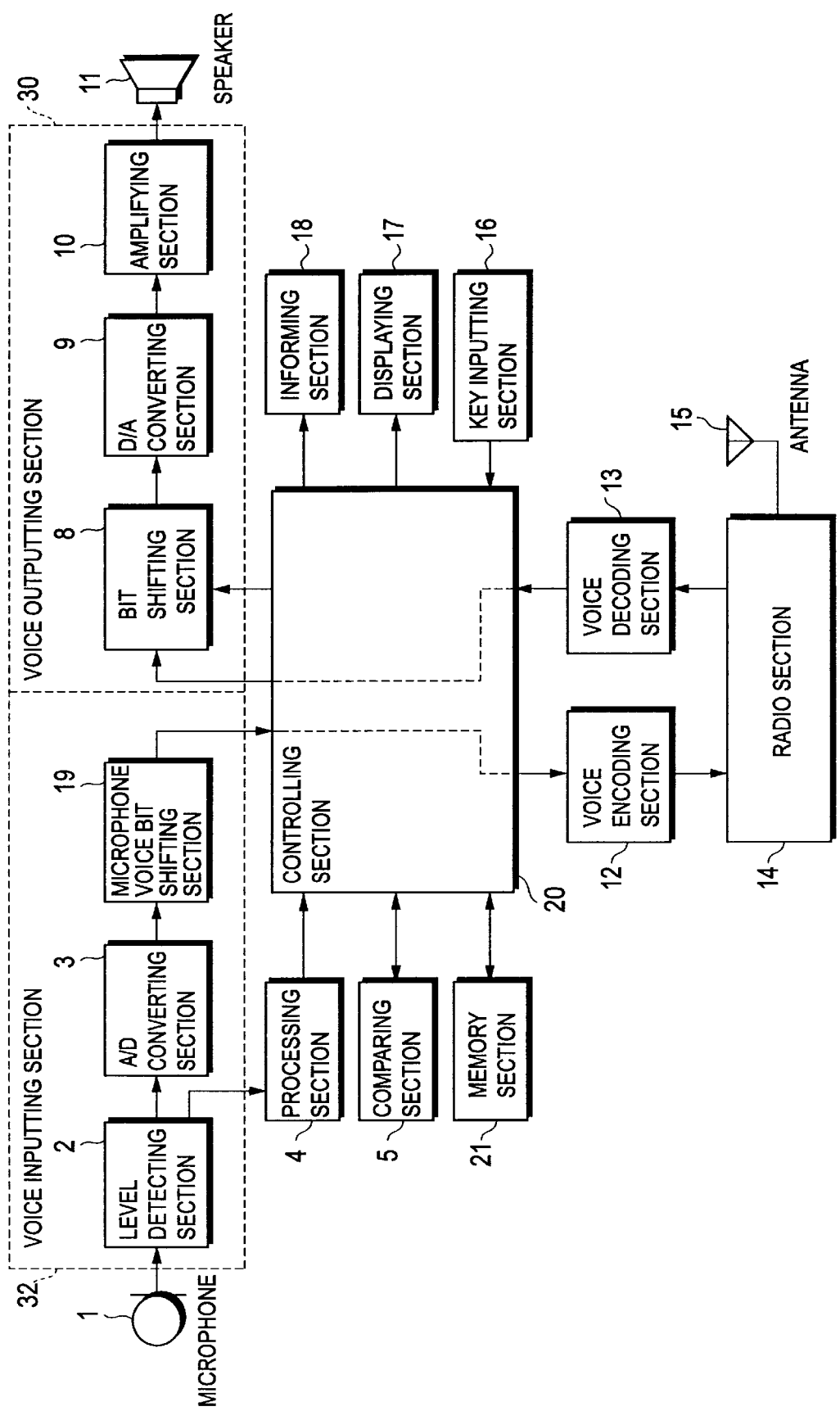
FIG. 6 is a block diagram showing a preferred example of a circuit constitution of a portable terminal device according to a second embodiment of the present invention.

FIG. 6 is a block diagram showing a portable terminal device according to a second embodiment of the present invention, preferably a preferred example of an internal circuit structure of a portable telephone. In FIG. 6, the components corresponding to those shown in FIG. 1 are denoted by the same reference numerals. Moreover, in order to avoid the redundancy, descriptions for them are omitted. In FIG. 6, a microphone voice bit shifting section 19 is newly provided in the voice inputting section 31 shown in FIG. 1, and a memory section 21 and a controlling section 20 are provided instead of the memory section 6 and the controlling section 7 shown in FIG. 1.

Referring to FIG. 6, the memory section 21 previously stores controlling signal information for controlling a microphone inputted voice, in addition to the controlling signal information for use in the speaker outputted voice control shown in FIG. 4. The controlling section 20 outputs a controlling signal to the microphone voice bit shifting section 19 and the bit shifting section 8, the controlling signal being based on the comparing result in the comparing section 5, that is, the comparing result between the average voice amplitude level computed by the processing section 4 and the reference amplitude level. The microphone voice bit shifting section 19 performs the bit shift for a digital voice signal which is outputted from the A/D converting section 3 based on the controlling signal outputted from the controlling section 20.

FIG. 7 is a figure showing a relationship between the controlling signal previously stored in the memory section 21 shown in FIG. 6 and a shift number shifted by the microphone voice bit shifting section 19.

Referring to FIG. 7, when the difference D between the average voice amplitude level computed by the processing section 4 and the reference amplitude level is in a range of D<−6, the controlling signal expressed as "010" is outputted to the microphone voice bit shifting section 19. When the difference D is in a range of −6≦D<−3, the controlling signal expressed as "001" is outputted to the microphone voice bit shifting section 19. When the controlling signal is "010" and "001" it is decided that the average voice amplitude level is lower than the reference amplitude, that is, it is decided that the voice volume that is currently being uttered becomes smaller than the voice volume of the first speed uttered by the user. At this time, the bit shift in the microphone voice bit shifting section 19 is performed in a direction where the level of the voice signal becomes higher, that is, in the left direction. The shift number more increases as the absolute value of the difference D is larger. In the example shown in FIG. 7, it is possible to shift the level of the voice signal in the left direction up to two bits at maximum.

On the other hand, when the difference D between the average voice amplitude level and the reference amplitude level computed by the processing section 4 is in a range of −3≦D≦3, the controlling signal expressed as "000" is outputted to the microphone voice bit shifting section 19. When the controlling signal is "000", it is decided that there is no large difference between the reference amplitude level and the average voice amplitude level computed by the comparing section 5, and the bit shift is not performed, so that the inputted voice of the user is outputted from the antenna 15 as it is.

Furthermore, when the difference D between the average voice amplitude level and the reference amplitude level computed by the processing section is in a range 3<D≦6, the controlling signal "111" is outputted to the microphone voice bit shifting section 19. When the difference D is in a range 6<D, the controlling signal "110" is outputted to the microphone voice bit shifting section 19. When the controlling signal is "111" and "110", it is decided that the average voice amplitude level is higher than the reference amplitude level, that is, it is decided that the voice volume that is currently being uttered becomes larger than the voice volume of the first speech uttered by the user. At this time, the bit shift in the microphone voice bit shifting section 19 is performed in a direction where the level of the voice signal becomes lower, that is, in the right direction. The shift number increases as the absolute value of the difference D is larger. In the example shown in FIG. 7, it is possible to shift the level of the voice signal in the left direction up to two bits at maximum.

As described above, in this embodiment, as the difference D becomes smaller, that is, as the inputted voice of the user becomes smaller, the level of the voice signal is shifted to the left, so that the level of the inputted voice of the user is made to be higher. Moreover, as the difference D becomes larger, that is, as the inputted voice of the user becomes larger, the level of the voice signal is shifted to the right, so that the level of the inputted voice of the user is made to be lower. Thus, the inputted voice level of the user is made to be closer to the reference amplitude level.

Furthermore, the voice level of the other person outputted from the speaker 11 is controlled based on the relationship between the controlling signal shown in FIG. 4 and the shift number shifted by the bit shifting section 8, similarly to the foregoing first embodiment.

Figure 8:
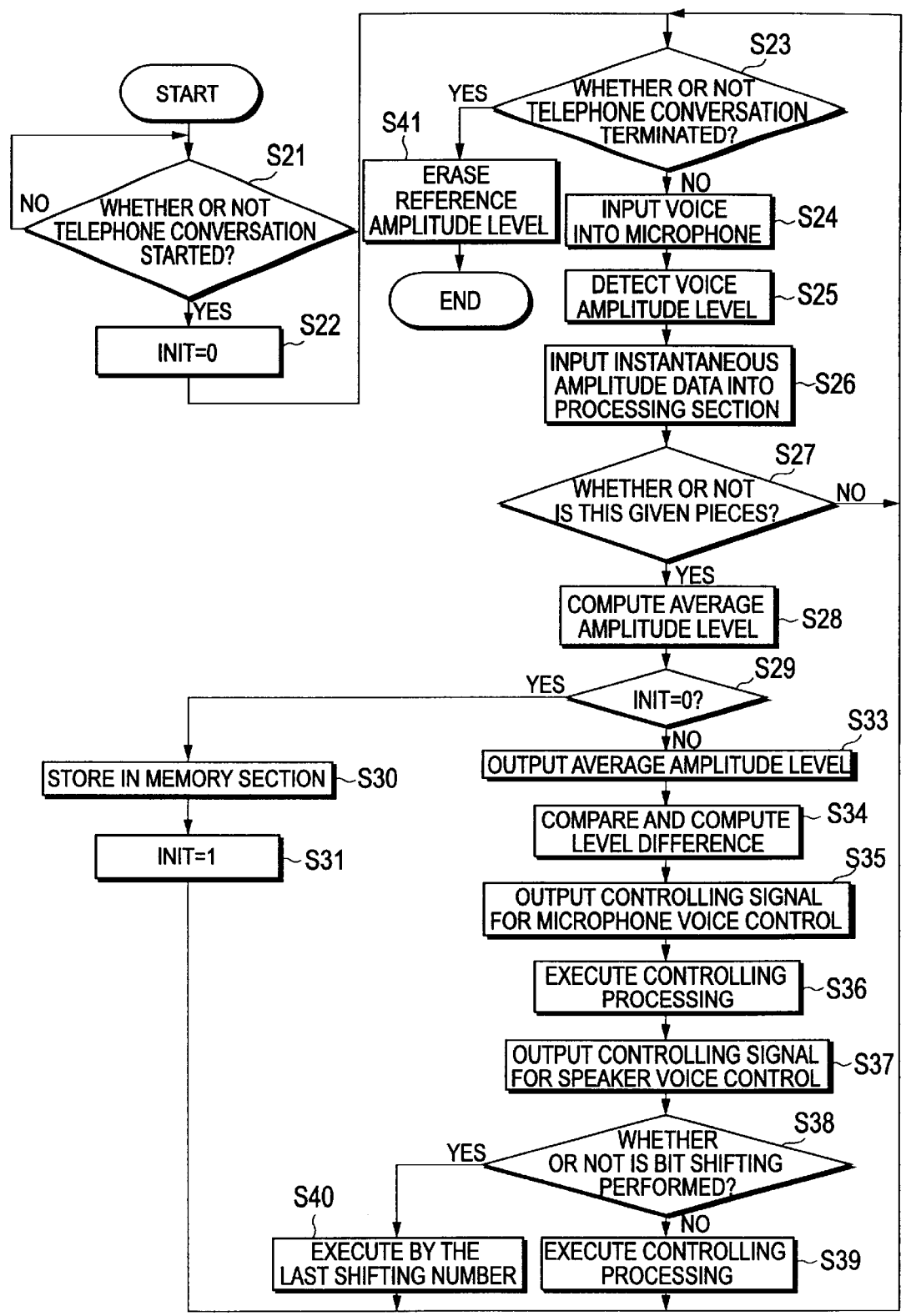
FIG. 8 is a flowchart showing a preferred example of an operation of a portable terminal device shown in FIG. 6.

Next, using FIG. 8, an operation of the preferred example of the portable telephone shown in FIG. 6 will be described. The steps 21 to 34 in FIG. 8 are the same as the steps 1 to 14 shown in FIG. 2, and the steps 38 to 40 in FIG. 8 are the same as the step 16 to 18 shown in FIG. 2. To prevent the redundancy, descriptions for them are omitted.

Referring to FIG. 8, when the difference between the average amplitude level of the inputted voice of the user computed by the processing section 4 and the reference amplitude level stored in the memory section 6 is detected (step S34), the controlling signal based on the detection value is outputted to the microphone voice bit shifting section 19 (step S35). In the microphone voice bit shifting section 19, based on the relationship between the controlling signal shown in FIG. 7 and the shift number shifted by the microphone voice bit shifting section 19, the bit shift processing is performed for the digital voice signal outputted from the A/D converting section 3, similarly to the first embodiment (step S36). At this time, when the controlling signal "000" indicating that "the bit shift is not performed" is inputted, the microphone voice bit shifting section 19 does not perform the bit shift processing of the last time like the bit shifting section 8, but the inputted voice level of the user is processed with the reference amplitude level. Like this, the microphone voice bit shifting section 19 performs the bit shifting processing for the inputted voice level of the user, based on the controlling signal inputted thereto, with a high fidelity.

Moreover, the controlling signal is outputted also to the bit shifting section 8, the controlling signal being based on the difference between the average amplitude level of the inputted voice of the user computed by the processing section 4 and the reference amplitude level stored in the memory section 6 (step S37). The control in the bit shifting section 8, that is, the control for the voice level outputted from the speaker 11, is the same described in the steps 16 to 18 of FIG. 2.

As described above, according to the portable telephone of this embodiment, the voice volume outputted from the speaker is controlled in accordance with the voice level inputted by the user. For this reason, it is possible to adjust the received voice volume by the user's will, automatically. Moreover, even if the inputted voice taken from the microphone 1 varies abruptly and the average voice amplitude level is greatly apart from the reference amplitude level, the inputted voice signal of the user can be transmitted to the other person after adjusting its level to approximately the same as the reference amplitude level. Therefore, against lowering of the inputted voice level caused by the deviation of the microphone position of the user and a rapid increase of the inputted voice level due to a sneeze, the voice signal with a uniform level can always be transmitted to the other person. Therefore, it is possible to remove the difficulty to catch the speech and displeasure which are given to the other person. Moreover, the necessity to adjust the received voice volume by manipulating the voice volume button like the conventional portable telephone is removed.

Figure 9:
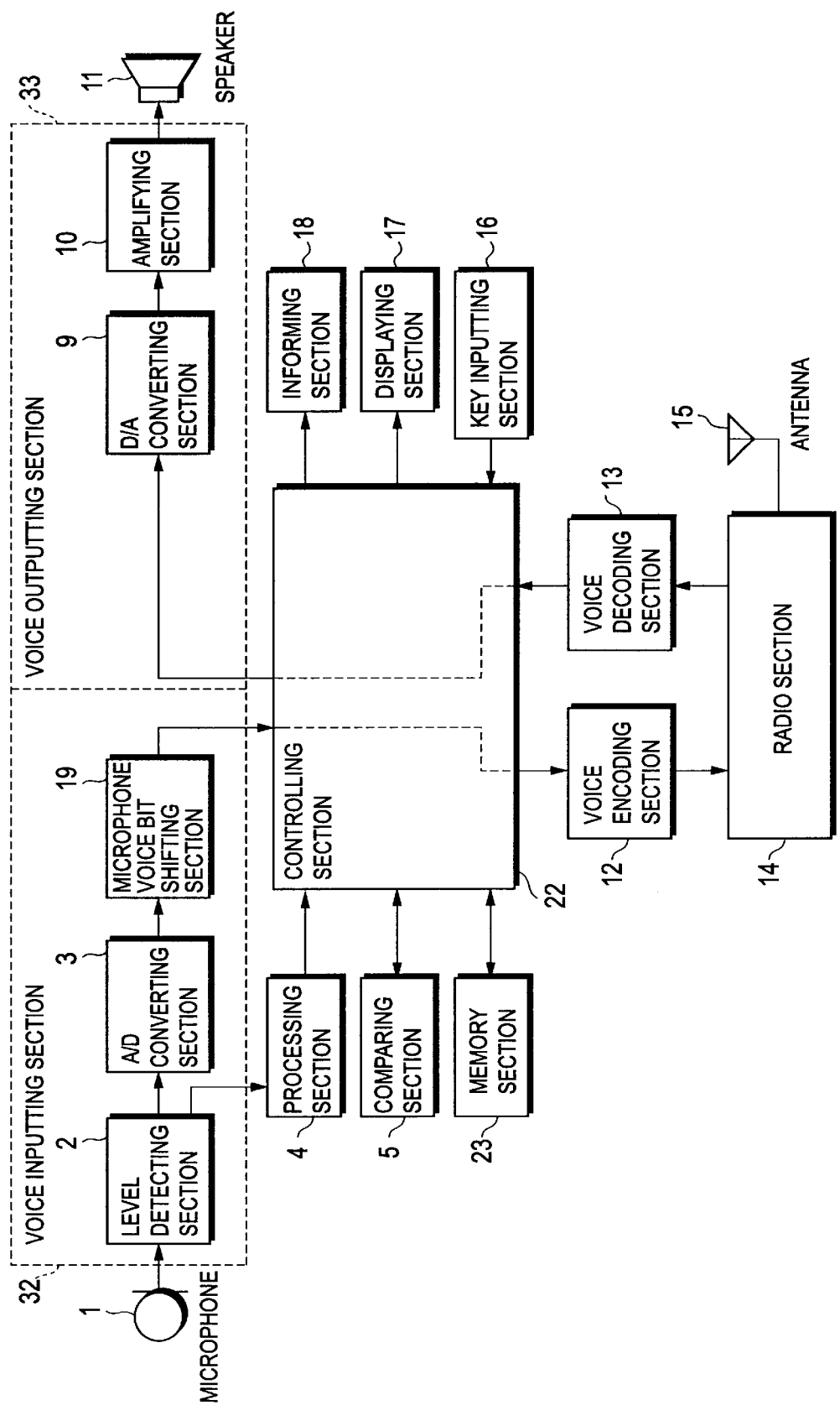
FIG. 9 is a block diagram showing a preferred example of a circuit constitution of a portable terminal device according to a third embodiment of the present invention.

FIG. 9 is a block diagram of a portable terminal device according to a third embodiment of the present invention, preferably a block diagram showing a preferred example of an internal circuit structure of a portable telephone. In FIG. 9, the components corresponding to the components of the portable telephone shown in FIG. 6 are denoted by the same reference numerals, and to prevent the redundancy, descriptions for them are omitted. In FIG. 9, the bit shifting section 8 in the voice outputting section 30 is removed, and a memory section 23 and a controlling section 22 are provided instead of the memory section 21 and the controlling section 20 shown in FIG. 6.

Referring to FIG. 9, the memory section 23 previously stores the controlling signal information for controlling the microphone inputted voice shown in FIG. 7. The controlling section 22 outputs a controlling signal based on the comparing result in the comparing section 5 to the microphone bit shifting section 19, that is, the comparing result of the average voice amplitude level computed by the processing section 4 with the reference amplitude level. The microphone voice bit shifting section 19 performs the bit shift for a digital voice signal outputted from the A/D converting section 3 based on the controlling signal outputted from the controlling section 20.

Figure 10:
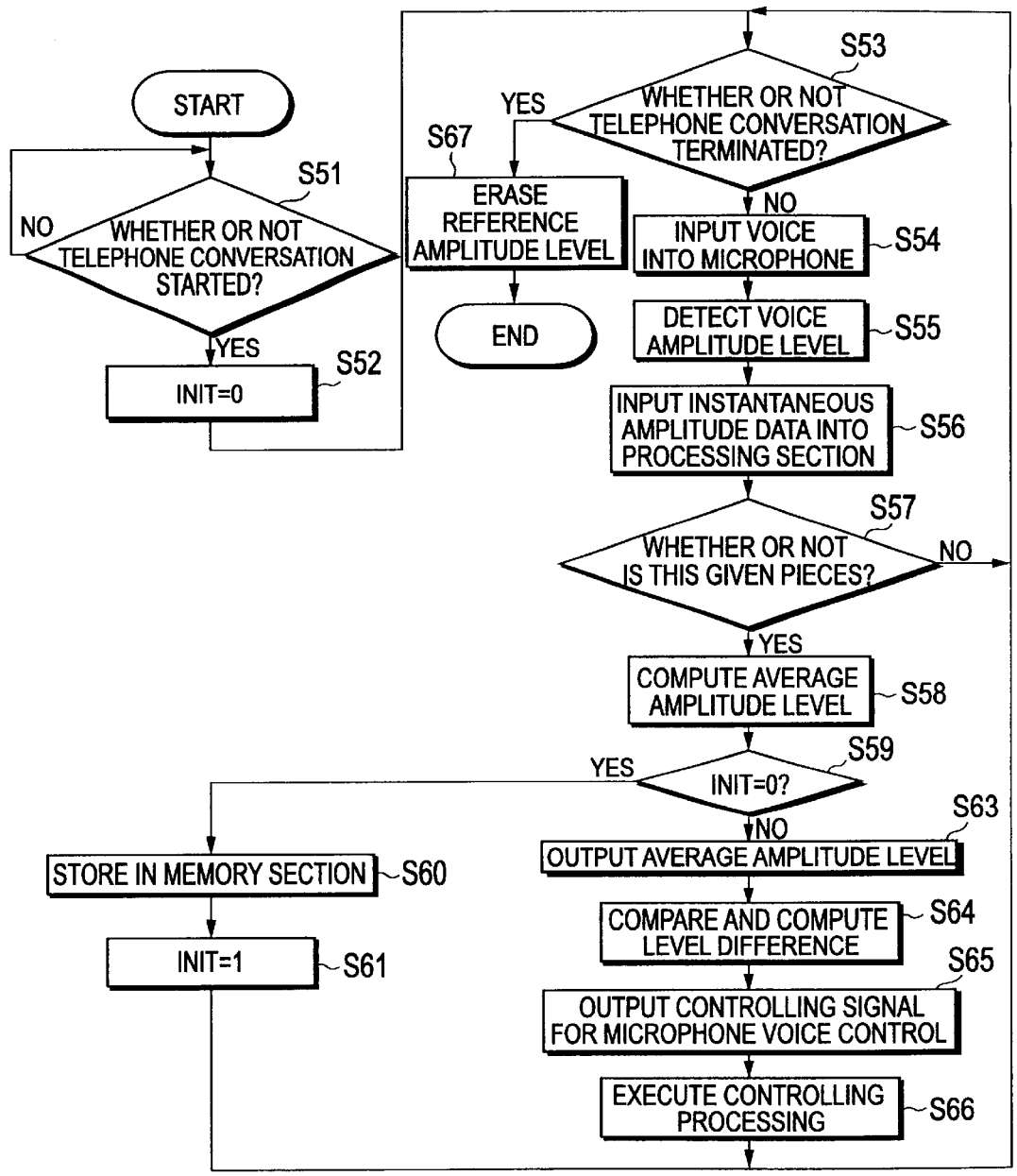
FIG. 10 is a flowchart showing a preferred example of an operation of a portable terminal device shown in FIG. 9

Using FIG. 10, an operation of the preferred example of the portable telephone shown in FIG. 9 will be described. The steps S51 to 66 in FIG. 9 are the same as the steps 21 to 36 shown in FIG. 8. To avoid the redundancy, the descriptions for them are here omitted. In the portable telephone according to this embodiment, based on the inputted voice level of the user the level of the voice signal to be transmitted to the other person is shifted in the microphone voice bit shifting section 19. However, the voice level outputted from the speaker 11 does not depend on the inputted voice level of the user. Specifically, the level of the voice signal transmitted from the other person is outputted from the speaker while keeping its level. Therefore, when the bit shift processing for the voice signal level to be transmitted is executed (step S66), no control for the outputted voice level is performed, and it is again decided whether or not the telephone conversation is terminated (step S53).

As described above, according to the portable telephone of this embodiment, even if the user speaks with a low voice or a loud voice, the voice of the user is always transmitted with a voice level near the reference amplitude level to the other person. A difficulty to catch the speech due to lowering of the inputted voice level caused by the deviation of the microphone position of the user and a rapid increase of the inputted voice level due to a sneeze can be removed. On the other hand, in the portable telephone according to this embodiment, no control is performed for the level of the voice signal of the other person outputted from the speaker 11. Accordingly, a voice volume outputted from the speaker 11 also varies in accordance with the level of the voice signal uttered by the other person. However, in this case, if also the other person performs the telephone conversation using the portable telephone according to this embodiment, the level of the voice signal outputted from the portable telephone of the other person is always controlled to the reference amplitude level. For this reason, as a result, the level of the voice signal outputted from the speaker 11 can be controlled to be near the reference amplitude level.

Hitherto, the descriptions for the present invention were made with reference to the preferred embodiments. However, the portable terminal device of the present invention is not limited to the above-described embodiments. For example, in the portable terminal device of this embodiment, the controlling signal outputted from the controlling section is set to five as shown in FIGS. 4 and 7. However, no limitation to the number of the controlling signals is made. In accordance with this, the threshold of the difference D and the bit shifting number for each controlling signal are not limited at all. Noted that it is preferable that in order to more finely control the inputted voice level of the user to be transmitted to the other person, as well as the outputted voice level of the other person outputted from the speaker, the number of the controlling signals is set to be large and the threshold of the difference D is precisely set.

Furthermore, in the portable terminal device according to the first and second embodiments of the present invention, when the controlling signal indicating that "the bit shift is not performed" is inputted as shown in the steps 16 to 18 of FIG. 2 and steps 38 to 40 of FIG. 8, the voice signal of the other person is outputted from the speaker 11 with the level of the voice signal in which the bit number was shifted in the last time, that is, the preceding level of the voice level. However, similarly to the bit shift control for the inputted voice level of the user to be transmitted to the other person, the level of the voice signal of the other person to be outputted from the speaker 11 may be processed with the reference amplitude level. For example, considerations are made to the case where the amplitude level of the microphone inputted voice which is inputted by the user becomes higher than the reference amplitude level and the level of the voice signal of the other person is once shifted in its shift number. Thereafter, when the amplitude level of the microphone inputted voice inputted by the user returns to the reference amplitude level and the controlling signal indicating that "no bit shift is performed" is inputted, the voice signal of the other person may be outputted with the reference amplitude level.

Furthermore, in the portable terminal device of this embodiment, the detection of the reference amplitude level is begun from the average amplitude level of the first speech of the user in the predetermined time immediately after starting the telephone conversation. However, no limitation is made for a detection timing of the reference amplitude level. Specifically, the detection may be begun from the average amplitude level of the inputted voice of the user in a predetermined time after passage of a certain time from the beginning of the telephone conversation. Moreover, if the user or a manufacturer previously sets by manipulating the key inputting section 16, there is no problem.

As described above, according to the portable terminal device of the first and second embodiments of the present invention, when the voice level inputted by the user becomes lower than the reference amplitude level, the voice level of the other person outputted from the speaker is made to be lowered. On the other hand, when the voice level inputted by the user becomes higher than the reference amplitude level, the voice level of the other person outputted from the speaker is made to be elevated. Therefore, since the voice level of the other person outputted from the speaker is controlled in accordance with the voice level inputted by the user, the volume received by the telephone can automatically be adjusted by the user's will.

Furthermore, considerations are made for the case where the amplitude level of the microphone inputted voice inputted by the user becomes higher than the reference amplitude level and the bit shift is once performed for the level of the voice signal of the other person to be outputted from the speaker 11. According to the portable terminal device of the first and second embodiment of the present invention, even if the amplitude level of the microphone inputted voice inputted by the user returns to the reference amplitude level, the voice signal of the other person is outputted from the speaker 11 with the amplitude level that is shifted in the last time. Therefore, even if the user keeps his mouth apart from the microphone unconsciously and the inputted voice level of the user returns to the reference amplitude level, the voice level of the other person to be outputted from the speaker is kept in the voice level that has been outputted.

Moreover, according to the portable terminal device of the second and third embodiments of the present invention, even if the inputted voice level taken from the microphone temporarily varies and it becomes greatly apart from the reference amplitude level, the inputted voice level of the user is adjusted so as to become a signal of a level as high as the reference amplitude level, and transmitted to the other person. Accordingly, the problem that the temporal variations of the inputted voice level caused by the deviation of the microphone position of the user and the sneeze by the user would give the difficulty to catch the speech and the displeasure to the other person can be removed. Furthermore, the other person is not required to adjust the received voice volume by manipulating the voice volume button.

Obviously, numerous additional modifications and variations of the present invention are possible in light of the above teaching. It is, therefore, to be understood that within the scope of the appended claim, the invention may be practical otherwise than as specifically described herein.

What is claimed is:

1. A portable terminal device comprising:
    voice inputting means for inputting a voice;
    voice outputting means for outputting a voice;
    detecting means for detecting a level of the voice inputted by said voice inputting means;
    controlling means for controlling at least one of a level of the voice outputted by said voice outputting means and a level of the voice inputted by said voice inputting means, in accordance with the inputted voice level detected by said, detecting means;
    comparing means for comparing the inputted voice level detected by said detecting means with a reference level;
    extracting means for extracting the level of the voice inputted by said voice inputting means for a first predetermined time; and
    computing means for computing an average of the inputted voice level extracted by said extracting means, within a second predetermined time, wherein said comparing means compares the average of the inputted voice level computed by said computing means with said reference level.

2. A portable terminal device comprising:
voice inputting means for inputting a voice;
voice outputting means for outputting a voice;
detecting means for detecting a level of the voice inputted by said voice inputting means;
controlling means for controlling at least one of a level of the voice outputted by said voice outputting means and a level of the voice inputted by said voice inputting means, in accordance with the inputted voice level detected by said, detecting means;
comparing means for comparing the inputted voice level detected by said detecting means with a reference level;
first deciding means for deciding a level of a first voice inputted by said voice inputting means at first after starting a telephone conversation;
second deciding means for deciding a level of a second voice inputted by said voice inputting means after the level of said first voice is decided by said first deciding means; and
computing means for computing a difference between the level of said first voice and the level of said second voice.

3. The portable terminal device as claimed in claim 2, said portable terminal device further comprising:
first outputting means for outputting a first controlling signal which elevates the level of the voice outputted by said voice outputting means when said difference is larger than a first threshold previously determined;
second outputting means for outputting a second controlling signal which does not elevate and decrease the level of the voice outputted by said voice outputting means when said difference is equal to or larger than a second threshold previously determined and equal to or smaller than said first threshold; and
third outputting means for outputting a third controlling signal which decreases the level of the voice outputted by said voice outputting means when said difference is smaller than said second threshold,
wherein said controlling means controls the level of the voice outputted by said voice outputting means, based on said first, second and third controlling signals.

4. The portable terminal device as claimed in claim 2, said portable terminal device further comprising:
first outputting means for outputting a first controlling signal which decreases the level of the voice inputted by said voice inputting means when said difference is larger than a first threshold previously determined;
second outputting means for outputting a second controlling signal which does not elevate and decrease the level of the voice inputted by said voice inputting means when said difference is equal to or larger than a second threshold previously determined and equal to or smaller than said first threshold; and
third outputting means for outputting a third controlling signal which elevates the level of the voice inputted by said voice inputting means when said difference is smaller than said second threshold,
wherein said controlling means controls the level of the voice inputted by said voice inputting means, based on said first, second and third controlling signals.

5. The portable terminal device as claimed in claim 2, said portable terminal device further comprising:
first outputting means for outputting a first controlling signal which decreases the level of the voice inputted by said voice inputting means and elevates the level of the voice outputted by said voice outputting means, when said difference is larger than a first threshold previously determined;
second outputting means for outputting a second controlling signal which does not elevate and decrease the level of the voice inputted by said voice inputting means as well as the level of the voice outputted by said voice outputting means, when said difference is equal to or larger, than a second threshold previously determined and equal to or smaller than said first threshold; and
third outputting means for outputting a third controlling signal which elevates the level of the voice inputted by said voice inputting means and decreases the level of the voice outputted by said voice outputting means, when said difference is smaller than said second threshold,
wherein said controlling means controls the level of the voice outputted by said voice outputting means and the level of the voice inputted by said voice inputted means, based on said first, second and third controlling signals.

6. The portable terminal device as claimed in claim 5, wherein when said controlling signal is outputted by said second outputting means, said controlling means controls the level of the voice outputted by said voice outputting means based on first and third controlling signals outputted prior to said second controlling signal.

7. The portable terminal device as claimed in claim 5, wherein when said second controlling signal is outputted by said second outputting means, said controlling means controls the level of the voice inputted by said voice inputting means, based on a level of said first voice.

8. A voice level controlling method of a portable terminal device comprising:
inputting a voice;
detecting a level of the voice inputted;
outputting a voice;
controlling at least one of a level of the voice inputted in said voice inputting and a level of the voice outputted in said voice outputting, based on the inputted voice level detected;
comparing the inputted voice level detected in said detecting step with a reference level;
extracting the level of the voice inputted in said voice inputting for a first predetermined time; and
computing an average of the inputted voice level extracted within a second predetermined time,
wherein, in said comparing, the average of the inputted voice level computed in said computing is compared with said reference level.

9. A voice level controlling method of a portable terminal device comprising:
inputting a voice;
detecting a level of the voice inputted;
outputting a voice;
controlling at least one of a level of the voice inputted in said voice inputting and level of the voice outputted in said voice outputting, based on the inputted voice level detected;

comparing the inputted voice level detected in said detecting with a reference level;
deciding a level of a first voice inputted by said voice inputting means at first after starting a telephone conversation;
deciding a level of a second voice inputted by said voice inputting means after the level of said first voice is decided by said first deciding means; and
computing a difference between the level of said first voice and the level of said second voice.

10. The voice level controlling method of a portable terminal device as claimed in claim 9,
said method further comprising:
outputting a first controlling signal which elevates the level of the voice outputted in said voice outputting when said difference is larger that a first threshold previously determined;
outputting a second controlling signal which does not elevate and decrease the level of the voice outputted in said voice outputting when said difference is equal to or larger than a second threshold previously determined and equal to or smaller than said first threshold; and
outputting a third controlling signal which decreases the level of the voice outputted in said voice outputting when said difference is smaller than said second threshold,
wherein, in said controlling, the level of the voice outputted in said voice outputting is controlled, based on said first, second and third controlling signals.

11. The voice level controlling method of a portable terminal device as claimed in claim 9,
said method further comprising:
outputting a first controlling signal which decreases the level of the voice inputted in said voice inputting when said difference is larger than a first threshold previously determined;
outputting a second controlling signal which does not elevate and decrease the level of the voice inputted in said voice inputting when said difference is equal to or larger than a second threshold previously determined and equal to or smaller than said first threshold; and
outputting a third controlling signal which elevates the level of the voice inputted in said voice inputting when said difference is smaller than said second threshold,
wherein, in said controlling the level of the voice inputted in said voice inputting is controlled, based on said first, second and third controlling signals.

12. The voice level controlling method of a portable terminal device as claimed in claim 9,
said method further comprising:
outputting a first controlling signal which decreases the level of the voice inputted in said voice inputting and elevates the level of the voice outputted in said voice outputting, when said difference is larger than a first threshold previously determined;
outputting a second controlling signal which does not elevate and decrease the level of the voice inputted in said voice inputting as well as the level of the voice outputted in said voice outputting, when said difference is equal to or larger than a second threshold previously determined and equal to or smaller than said first threshold; and
outputting a third controlling signal which elevates the level of the voice inputted in said voice inputting and decreases the level of the voice outputted in said voice outputting, when said difference is smaller than said second threshold,
wherein, in said controlling the level of the voice outputted in said voice outputting and the level of the voice inputted by said voice inputting are controlled, based on said first, second and third controlling signals.

13. A portable terminal device comprising:
voice inputting means for inputting a voice;
voice outputting means for outputting a voice;
detecting means for detecting a level of the voice inputted by said voice inputting means;
controlling means for controlling at least one of a level of the voice outputted by said voice outputting means and a level of the voice inputted by said voice inputting means, in accordance with the inputted voice level detected by said, detecting means; and
comparing means for comparing the inputted voice level detected by said detecting means with a reference level,
wherein when said comparing means decides that said inputted voice level is higher than said reference level, said controlling means elevates the level of the voice outputted by said voice outputting means, and when said comparing means decides that said inputted voice level is lower than said reference level, said controlling means decreases the level of the voice outputted by said voice outputting means.

14. The portable terminal device as claimed in claim 13,
wherein said reference level is the inputted voice level detected by said detecting means immediately after starting a telephone conversation.

15. The portable terminal device as claimed in claim 13,
wherein said reference level is erased upon termination of the telephone conversation.

16. The portable terminal device as claimed in claim 13, further comprising:
selecting means for selecting at least one of the inputted voice level detected by said detecting means immediately after starting the telephone conversation and a level previously determined, as said reference level.

17. The portable terminal device as claimed in claim 13, wherein said portable terminal device is a portable telephone.

18. A portable terminal device comprising:
voice inputting means for inputting a voice;
voice outputting means for outputting a voice;
detecting means for detecting a level of the voice inputted by said voice inputting means;
controlling means for controlling at least one of a level of the voice outputted by said voice outputting means and a level of the voice inputted by said voice inputting means, in accordance with the inputted voice level detected by said, detecting means; and
comparing means for comparing the inputted voice level detected by said detecting means with a reference level,
wherein when said comparing means decides that said inputted voice level is higher than said reference level, said controlling means decreases the level of the voice outputted by said voice outputting means, and when said comparing means decides that said inputted voice level is lower than said reference level, said controlling means elevates the level of the voice outputted by said voice outputting means.

19. The portable terminal device as claimed in claim 18, wherein said reference level is the inputted voice level detected by said detecting means immediately after starting a telephone conversation.

20. The portable terminal device as claimed in claim 18, wherein said reference level is erased upon termination of the telephone conversation.

21. The portable terminal device as claimed in claim 18, further comprising:
selecting means for selecting at least one of the inputted voice level detected by said detecting means immediately after starting the telephone conversation and a level previously determined, as said reference level.

22. The portable terminal device as claimed in claim 18, wherein said portable terminal device is a portable telephone.

23. A portable terminal device comprising:
voice inputting means for inputting a voice;
voice outputting means for outputting a voice;
detecting means for detecting a level of the voice inputted by said voice inputting means;
controlling means for controlling at least one of a level of the voice outputted by said voice outputting means and a level of the voice inputted by said voice inputting means, in accordance with the inputted voice level detected by said detecting means; and
comparing means for comparing the inputted voice level detected by said detecting means with a reference level,
wherein when said comparing means decides that said inputted voice level is higher than said reference level, said controlling means decreases the level of the voice inputted by said voice inputting means and elevates the level of the voice outputted by said voice outputting means, and
when said comparing means decides that said inputted voice level is lower than said reference level, said controlling means elevates the level of the voice inputted by said voice inputting means and decreases the level of the voice outputted by said voice outputting means.

24. The portable terminal device as claimed in claim 23, further comprising:
selecting means for selecting either a control for the level of the voice inputted by said voice inputting means or a control for the level of the voice outputted by said voice outputting means.

25. The portable terminal device as claimed in claim 24, wherein said reference level is the inputted voice level detected by said detecting means immediately after starting a telephone conversation.

26. The portable terminal device as claimed in claim 24, wherein said reference level is erased upon termination of the telephone conversation.

27. The portable terminal device as claimed in claim 24, further comprising:
selecting means for selecting at least one of the inputted voice level detected by said detecting means immediately after starting the telephone conversation and a level previously determined, as said reference level.

28. The portable terminal device as claimed in claim 24, wherein said portable terminal device is a portable telephone.

29. The portable terminal device as claimed in claim 23, wherein said reference level is the inputted voice level detected by said detecting means immediately after starting a telephone conversation.

30. The portable terminal device as claimed in claim 23, wherein said reference level is erased upon termination of the telephone conversation.

31. The portable terminal device as claimed in claim 23, further comprising:
selecting means for selecting at least one of the inputted voice level detected by said detecting means immediately after starting the telephone conversation and a level previously determined, as said reference level.

32. The portable terminal device as claimed in claim 23, wherein said portable terminal device is a portable telephone.

33. A portable terminal device comprising:
a voice inputting section for inputting a voice;
a voice outputting section for outputting a voice;
a detecting section for detecting a level of the voice inputted by said voice inputting section;
a controlling section for controlling at least one of a level of the voice outputted by said voice outputting section and a level of the voice inputted by said voice inputting section, in accordance with the inputted voice level detected by said detecting section; and
a comparing section for comparing the inputted voice level detected by said detecting section with a reference level,
wherein when said comparing section decides that said inputted voice level is higher than said reference level, said controlling section elevates the level of the voice outputted by said voice outputting section, and when said comparing section decides that said inputted voice level is lower than said reference level, said controlling section decreases the level of the voice outputted by said voice outputting section.

34. A voice level controlling method for a portable terminal device, comprising:
inputting a voice;
detecting a level of the voice inputted;
outputting a voice;
controlling at least one of a level of the voice inputted in said voice inputting and level of the voice outputted in said voice outputting, based on the inputted voice level detected; and
comparing the inputted voice level detected with a reference level,
wherein when it is decided in said comparing that said inputted voice level is higher than said reference level, the level of the voice outputted is elevated, and when it is decided in said comparing that said inputted voice level is lower than said reference level, the level of the voice outputted is decreased.

35. The voice level controlling method of a portable terminal device as claimed in claim 34, wherein when it is decided in said comparing that said inputted voice level is higher than said reference level, the level of the voice inputted is decreased, and when it is decided in said comparing that said inputted in voice level is lower than said reference level, the level of the voice inputted is elevated.

36. The voice level controlling method of a portable terminal device as claimed in claim 34, wherein when it is decided in said comparing that said inputted voice level is higher than said reference level, the level of the voice inputted is decreased and the level of the voice outputted is elevated, and when it is decided in said comparing that said inputted voice level is lower than said reference level, the level of the voice outputted is decreased.

* * * * *